US009741162B2

United States Patent
Martinez Canedo et al.

(10) Patent No.: US 9,741,162 B2
(45) Date of Patent: Aug. 22, 2017

(54) FUNCTIONAL VISUALIZATION IN SYSTEM-LEVEL MULTI-DOMAIN SIMULATORS

(71) Applicant: Siemens Industry Software NV, Leuven (BE)

(72) Inventors: Arquimedes Martinez Canedo, Plainsboro, NJ (US); Ling Shen, Cherry Hill, NJ (US)

(73) Assignee: Siemens Industry Software NV, Leuven (BE)

( * ) Notice: Subject to any disclaimer, the term of this patent is extended or adjusted under 35 U.S.C. 154(b) by 120 days.

(21) Appl. No.: 14/688,189

(22) Filed: Apr. 16, 2015

(65) Prior Publication Data

US 2015/0302640 A1 Oct. 22, 2015

Related U.S. Application Data

(60) Provisional application No. 61/982,394, filed on Apr. 22, 2014.

(51) Int. Cl.
*G06T 17/00* (2006.01)
*G06F 17/50* (2006.01)
*G05B 17/02* (2006.01)
*G05B 19/042* (2006.01)

(52) U.S. Cl.
CPC .............. *G06T 17/00* (2013.01); *G05B 17/02* (2013.01); *G05B 19/0426* (2013.01); *G06F 17/5009* (2013.01)

(58) Field of Classification Search
CPC .......... G05B 23/0267; G05B 19/41885; G05B 2219/25067; G05B 2219/31467; G05B 2219/31469; G05B 2219/31472; G05B 2219/31474; G05B 2219/32128; G05B 2219/32342; G05B 2219/23258; G05B 2219/23445; G05B 2219/31396; G05B 23/0216; G06F 8/34; G06F 8/20;

(Continued)

(56) References Cited

U.S. PATENT DOCUMENTS

2006/0277010 A1  12/2006  Schutte et al.
2007/0067056 A1*  3/2007  Nishinohara .... G05B 19/41885
                                                              700/97

(Continued)

OTHER PUBLICATIONS

EP Publication Search Report mailed Sep. 30, 2015 corresponding to PCT International Application No. 15164597.5 filed Apr. 22, 2015 (2 pages).

(Continued)

*Primary Examiner* — Haixia Du

(57) ABSTRACT

A functional visualization of high-level system variables is based on information from a simulation environment. A functional model is imported from the simulation environment, including function nodes and connections. Each function node includes a function name, an associated component from the simulated system, and an associated physical variable. Each connection includes source and destination functions and a connection type. Values for the physical variables are obtained via a subscription with the simulation environment. The functional visualization is created and displayed based on the functional model and the values.

20 Claims, 9 Drawing Sheets

(58) Field of Classification Search
CPC ............. G06F 11/3664; G06F 11/2733; G06F 17/5022; G06F 17/5045; G06F 17/505; G06F 19/26
See application file for complete search history.

(56) References Cited

U.S. PATENT DOCUMENTS

2007/0132779 A1* 6/2007 Gilbert ............... G05B 19/0426 345/619
2012/0029661 A1* 2/2012 Jones ................ G05B 19/0426 700/17

OTHER PUBLICATIONS

Angst Gerhard; "Visualization of SPICE files helps to optimize SoCs SOC Design"; retrieved on Mar. 9, 2015 from the Internet: URL:http://www.concept.de/ECE_apr04.pdf; pp. 10-11; XP055211082;; 2004.
Brochure, Siemens PLM Software, LMS Imaginelab Amesim, The de facto tool for physical simulation of mechatronic systems, siemens.com/plm/lms (2014).
Brochure, DRVVEH4A-constant load vehicle with or without slip, IFP Drive Library, Siemens LMS Imagine (2013).

* cited by examiner

FUNCTIONAL VISUALIZATION IN SYSTEM-LEVEL MULTI-DOMAIN SIMULATORS

CROSS-REFERENCE TO RELATED APPLICATIONS

This application claims priority to U.S. provisional application Ser. No. 61/982,394 filed Apr. 22, 2014, the disclosure of which is incorporated by reference herein in its entirety.

BACKGROUND

1. Field of the Disclosure

The disclosure relates to simulation methods and apparatus. More specifically, it relates to methods and systems for providing a visual representation of the coupling between simulated functions and physical behaviors.

2. Description of the Prior Art

Simulation environments, such as the LMS Imagine.Lab Amesim mechatronic simulation environment available from Siemens PLM Division of Plano, Tex., provide physical simulation of mechatronic systems at the system, subsystem and component level. Currently, such system-level multi-domain simulators support primarily low-level visualization of physical variables in the form of time series and graphs, but do not provide a high-level contextualization of what those variables mean and do.

There is a need in the art for a tool providing visual coupling between functions as defined in such simulation environments and their physical manifestations.

A further need exists in the art for a tool for understanding physical behaviors at a level of abstraction higher than that of available simulation environments, thus improving the comprehension of specific behaviors and scenarios.

An additional need exists in the art for an alternative technique for a user to track and debug the functionality of a system during the early stages of design.

A further need exists in the art for a tool that provides a concrete implementation for simulators to connect detailed simulations to systems engineering models and requirements.

SUMMARY

Accordingly, it is an object of the present disclosure to provide a tool suitable for simulation environments such as Amesim for use in visually coupling functions and their physical manifestations. The tool should enhance understanding of physical behaviors at a higher-level of abstraction, thus improving the comprehension of specific behaviors and scenarios.

It is a further object of the disclosure to provide a technique for users to access the energy, material, and signal flows of a simulated system to better understand whether the system is performing "wanted," "unwanted" or "unused" functions.

Exemplary embodiments of the invention feature a method for visualizing functions of a system based on data from a simulation environment. A functional model of the system is imported from the simulation environment, including a plurality of function nodes and a plurality of connections, each connection linking two of the function nodes. For each of the function nodes, a function configuration triple is created, including a function description, a system component with which the function is associated, and a system variable with which the function is associated. For each of the connections, a connection configuration triple is created, including a source function and a destination function selected from the function nodes, and a type of flow associated with the connection.

A functional visualization file is generated from the function configuration triples and the connection configuration triples. A subscription is made to receive values for each of the system variables through a connection with the simulation environment. A functional visualization is then displayed based on the functional visualization file and the system variables.

The functional visualization may be generated according to an XML schema file describing a specific file format understood by the simulation environment. Generating the functional visualization file may further include setting visualization attributes for each of the function nodes and connections. Those visualization attributes may be coordinates, color, size, font type, and appearance of function nodes and connections. The visualization attributes may cause changes in appearance of function nodes and connections depending on conditions met by the system variables.

The simulation environment may be capable of interactive simulation, in which case the subscription to receive values for each of the system variables through a connection with the simulation environment includes establishing a connection with a simulation server of the simulation environment and subscribing to receive values of the system variables as they are available. Alternatively, the simulation environment may not be capable of interactive simulation, in which case the subscription to receive values for each of the system variables through a connection with the simulation environment includes subscribing to receive a simulation results file from the simulation environment.

Displaying a functional visualization based on the functional visualization file and the system variables may include displaying function descriptions together with values for associated system variables, and connections connecting the source functions and the destination functions. The connections may be displayed according to the type of flow associated with the connection. The connections may also be displayed according to the values of the system variables.

Another exemplary embodiment of the invention features a system for visualizing functions of a system based on data from a simulation environment. The system includes a processor, an interface between the processor and the simulation environment, a graphical display connected to the processor, and computer readable media containing computer readable instructions that, when executed by the processor, cause the processor to perform operations. The operations include: importing a functional model of the system via the interface between the processor and the simulation environment, including a plurality of function nodes and a plurality of connections, each connection linking two of the function nodes; for each of the function nodes, creating a function configuration triple including a function description, a system component with which the function is associated, and a system variable with which the function is associated; for each of the connections, creating a connection configuration triple including a source function and a destination function selected from the function nodes, and a type of flow associated with the connection; generating a functional visualization file from the function configuration triples and the connection configuration triples; subscribing to receive values for each of the system variables through the interface between the processor and the simulation environment; and displaying, using the graphical display, a functional visualization based on the functional visualization file and the system variables.

The respective objects and features of the exemplary embodiments of the invention may be applied jointly or severally in any combination or sub-combination by those skilled in the art.

BRIEF DESCRIPTION OF THE DRAWINGS

The invention is explained in more detail with reference to an exemplary embodiment illustrated in a drawing, in which.

Like parts are labeled with the same reference signs in all the figures.

DETAILED DESCRIPTION

The presently disclosed functional visualization tool is suitable for simulation environments such as Amesim because it provides a visual coupling between functions and their physical manifestations. That is useful for users to understand physical behaviors at a higher-level of abstraction, thus improving their comprehension of specific behaviors and scenarios. Through the functional visualization tool, users can access the energy, material, and signal flows so that they can better understand whether the system is performing "wanted," "unwanted" or "unused" functions. That provides another option for a user to track and debug the functionality of the system during the early stages of design.

Currently, system-level multi-domain simulators like Amesim focus on low-level visualization of physical variables, and do not provide a high-level contextualization of what those variables mean and do. The presently disclosed visualization tool bridges that gap and provides a concrete implementation for simulators to connect detailed simulations to systems engineering models and requirements.

Figure 1:
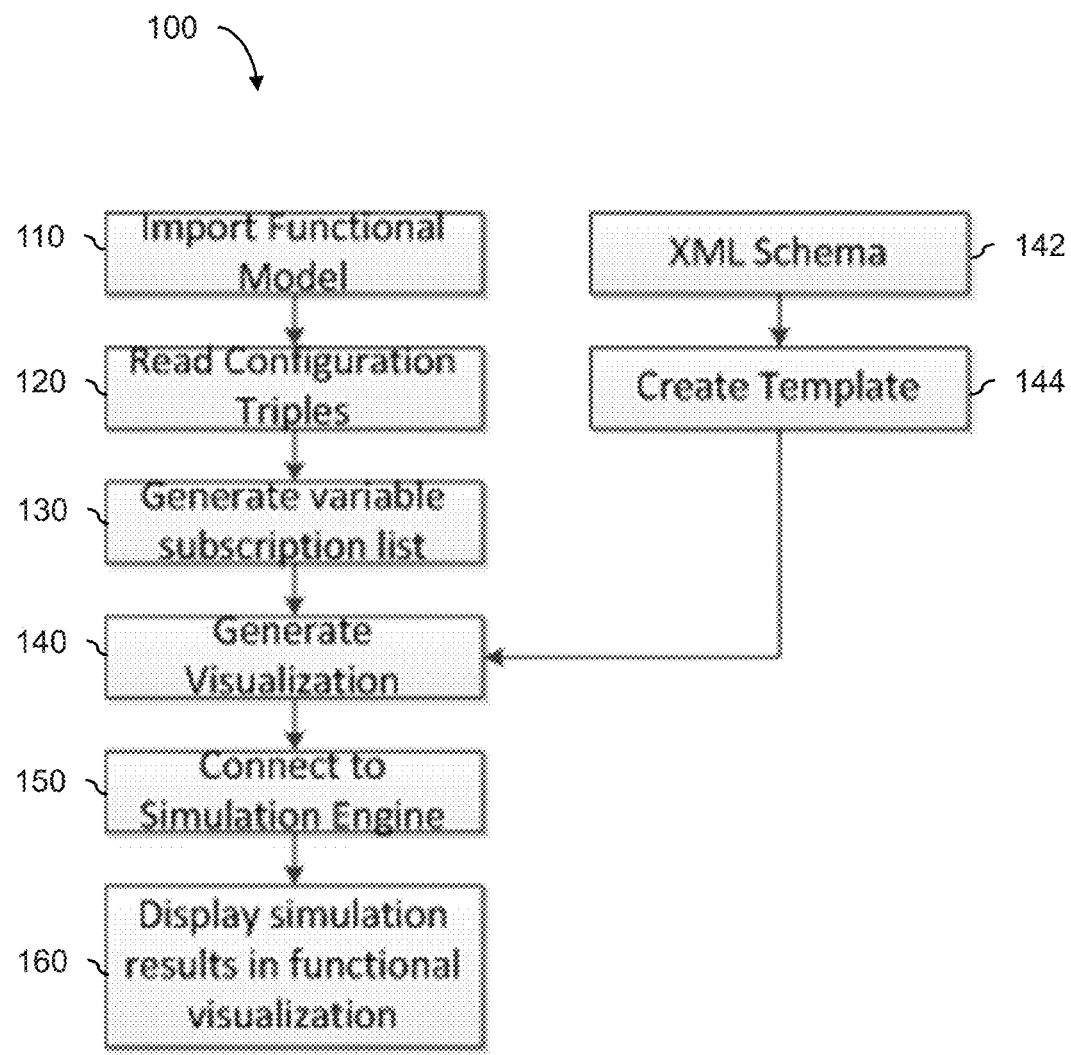
FIG. 1 is a flow chart showing a method according to embodiments of the disclosure.

The flow chart 100 depicted in FIG. 1 summarizes the principal steps of the disclosed simulation visualization technique. In block 110, a functional model is imported from the simulation environment. At block 120, configuration triples are read for each element of the imported functional model. Based on variables included in those triples, a variable subscription list is generated at block 130. Using the imported model, a visualization file is generated at block 140. The visualization file may be based on an XML schema file 142 describing a specific file format understood by the simulation environment. The XML schema file 142 is used to create a template 144 used in generating the visualization 140.

The system then connects to the simulation engine in the simulation environment at block 150 to retrieve simulated values for the variables on the variable subscription list. The system then displays, at block 160, the functional visualization incorporating those values.

Details of several of the steps described above with reference to FIG. 1 will now be discussed in detail.

The functional model imported in operation 110 of FIG. 1 is a graph in which nodes represent functions and edges represent flows or connections that connect functions. Both the nodes and the edges are labeled with a set of attributes such as a name using a pre-defined vocabulary of functions. In the present implementation, the Functional Basis taxonomy published by the National Institute of Standards and Technology (NIST) is used, but there are other functional taxonomies available. Having a fixed pre-defined vocabulary makes the user more efficient and simplifies the processing for the tool.

Figure 2:
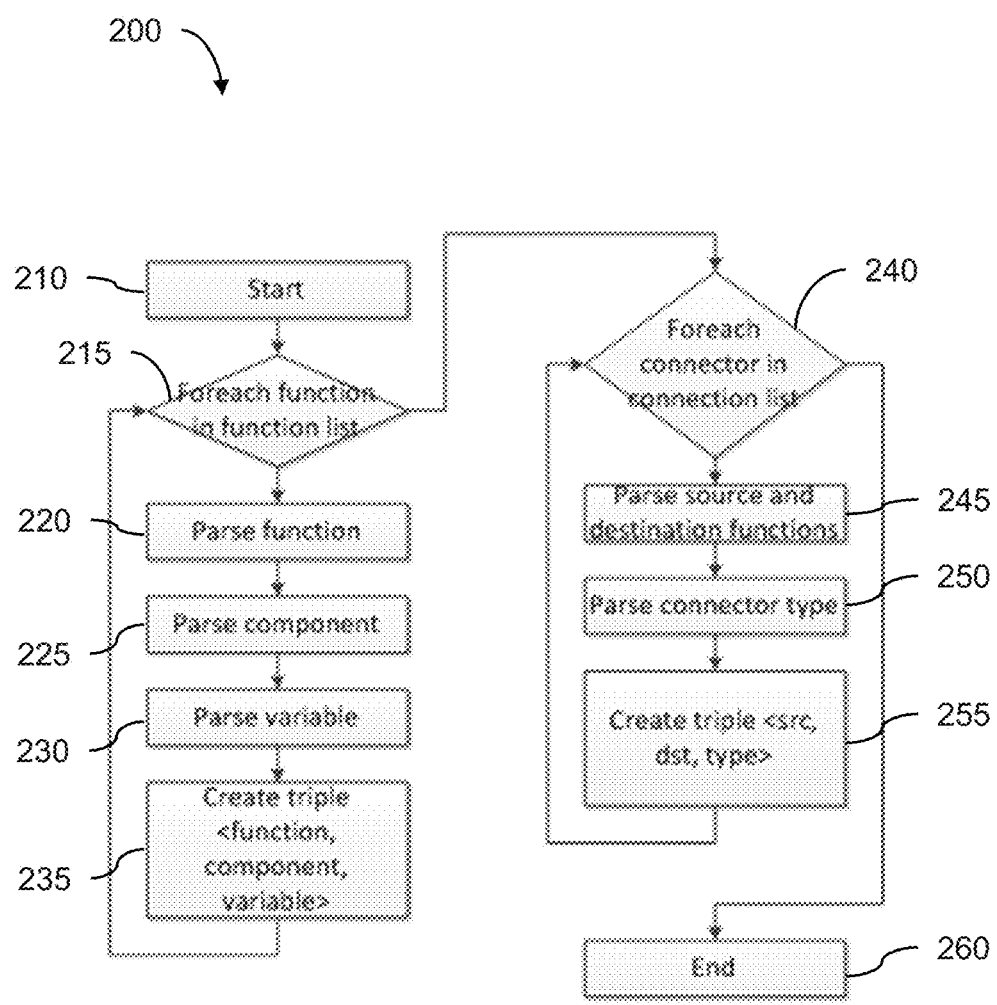
FIG. 2 is a flow chart showing details of the import functional model operation according to embodiments of the disclosure.

A flow chart 200, shown in FIG. 2, illustrates an exemplary workflow in the import functional model operation 100 of FIG. 1. After starting at 210, a series of operations are performed on each function 215 in the model. The relevant annotations in the functions in a functional model are the high-level function, which is parsed at 220, the component it associates to, which is parsed at 225, and the physical variable it associates to in the low-level simulation model, which is parsed at 230. The presently described functional visualization assumes that those annotations are available. There are existing tools and methods that allow that association, and the details of those tools and methods are outside the scope of this disclosure. Using the annotations, the described technique creates a triple <function, component, variable> at block 235 that associates a high-level function to a specific physical variable in a component in the simulation.

Note that more than one variable may be associated with a given function of the functional model. In that case, the variable element of the triple may be an array of variables. For example, a function F1 may be mapped to variables V1, V2, V3. F1 would be visualized according to a statement S1 that relates the three variables. For example, a statement S1 may map F1 to V1, V2, V3 according to F1→V1+V2/V3.

Returning to FIG. 2, operations are also performed on each of the connections or edges (block 240). The relevant annotations in the edges of a functional model are: in which function the edge originates and at which function the edge terminates, which are parsed at 245, and what type of flow it carries, which is parsed at 250. Using those annotations, the method creates a triple <source function, destination function, connector type> at block 255 that specifies from which function it originates, and to which function it reaches, and what type of flow it carries. The operation ends (block 260) after all the functions and connectors are parsed.

The type of flow is determined using a pre-defined vocabulary and typically includes energy, material, and signal flows and sub-flows (e.g. mechanical energy, electrical energy, gas material, etc.). In the presently described implementation, the Functional Basis taxonomy is used to define connector types. Additional attributes defining the appearance of the nodes and connectors may also be included or computed from the triples. Those attributes may include one or more of coordinates, color, size, font type, and appearance of function nodes and connections. The attributes may additionally include transitions of appearance on function nodes and connections depending on conditions met by system variables. For example, a node may be configured to change color to red if a temperature is greater than 100° C.

Figure 3A:
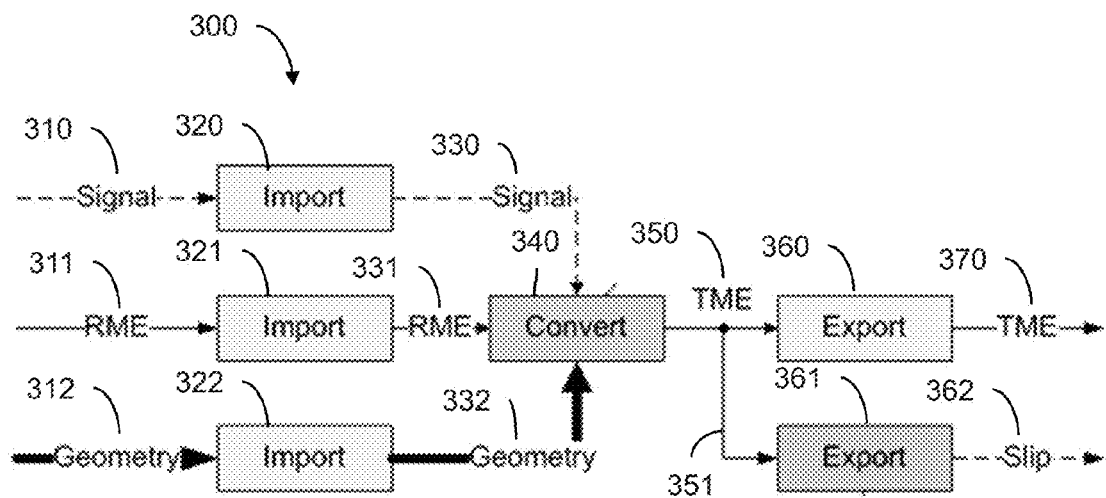
FIG. 3A is a block diagram showing a functional model of a vehicle simulation component to be processed by an import functional model operation according to embodiments of the disclosure.

The import of functional models and the creation of triples are illustrated by the functional model 300 of FIG. 3A. The functional model 300 includes six functions 320, 321, 322, 340, 360, 361 and five flows 330, 331 332, 350, 351 (ignoring the interface flows that only have a source or a destination but not both). The functional model 300 describes a vehicle simulation component in Amesim that takes as an input a braking signal 310, rotational mechanical energy 311, and converts those to translational mechanical energy 370 and wheel slip 362 while taking into consideration the geometric properties 312 of the simulated vehicle.

Figure 3B:
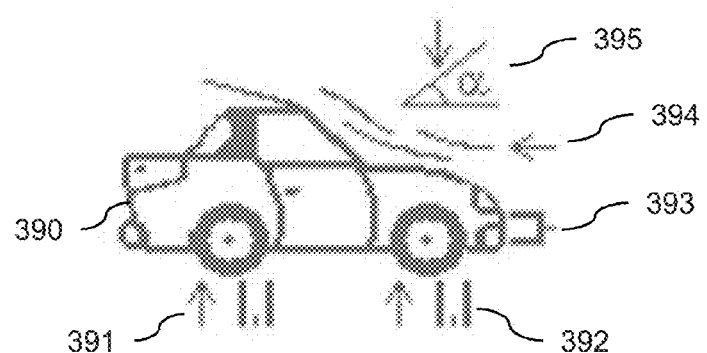
FIG. 3B is an illustration of an exemplary physical system used in a demonstration of the functional visualization according to embodiments of the disclosure.

The vehicle 390 portrayed in FIG. 3B illustrates an example set of inputs of a simulation component such as the simulation component described by the functional model 300. Inputs might include road slope 395, wind speed 394, wheel rotational velocity and torque 392, wheel braking 391 and vehicle velocity components and drag 393.

The low-level equations associated with a simulation component such as that illustrated by the vehicle 390 of FIG. 3B are difficult to debug and interpret. The functional model 300 of FIG. 3A provides a high-level overview of what is happening in the low-level equations.

Figure 4:
FIG. 4 is a textual representation of a function list and a connection list showing triples according to embodiments of the disclosure.

After the Import Functional Model operation is executed in this example, six triples for functions (one for each function), and five triples for flows (one for each flow) are created. A textual representation 400 of the generated triples is shown in FIG. 4. For example, in line 5, the "Export TME" function is associated to the "mtot@drv_4wheelsvehicle" variable in the "DRVVEH4A" component in Amesim. In another example, the flow that originates in "Convert RME to TME" function and ends in the "Export TME" function (line 12) has a "direct" type of connection that represents an energy flow.

The second step depicted in the flow chart 100 of FIG. 1, read configuration triples (block 120), takes the function triples and connection triples as an input and generates a functional visualization file as an output. To accomplish this in an efficient manner, an XML schema file that describes the specific file format for the simulator to understand the functional visualization is used to create a reusable template for functions and connections. In the presently described implementation, the XML schema describes the "DSK" file format utilized by LMS Imagine.Lab Amesim to visualize graphs. Other simulators, however, may have different formats. The described method is a generalized method that may accommodate any other visualization file formats.

Figure 5:
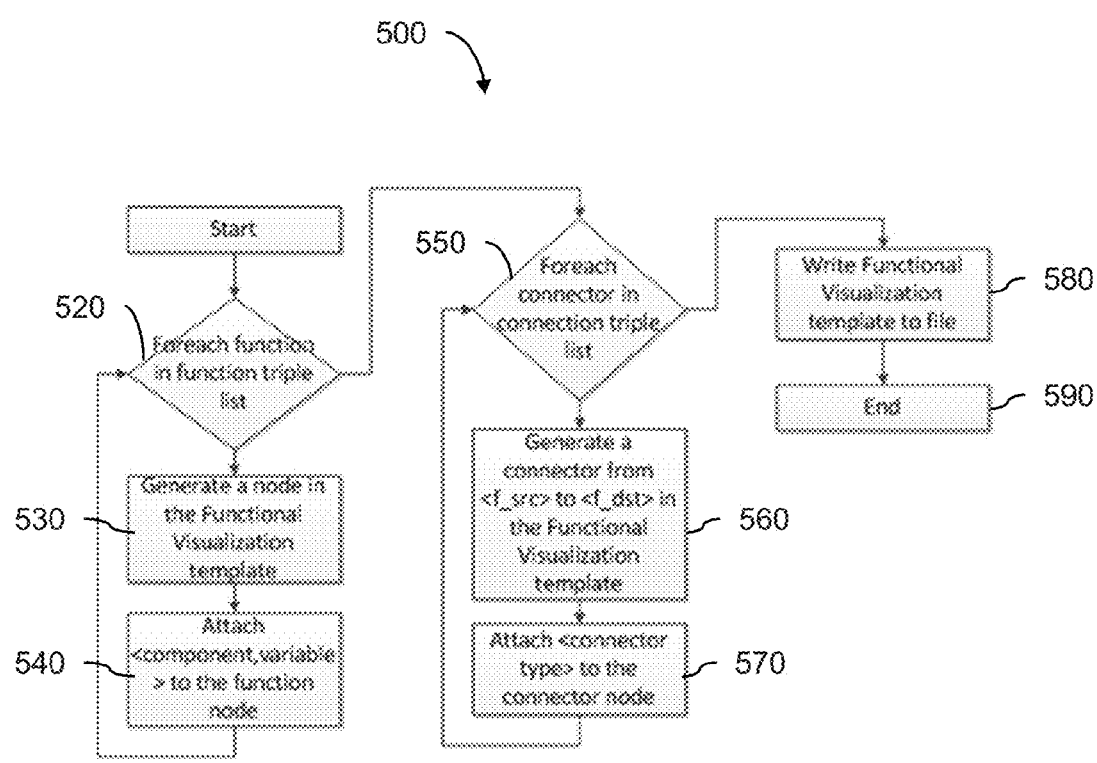
FIG. 5 is a block diagram showing details of the read configuration triples operation according to embodiments of the disclosure.

Sub-operations of the read configuration triples operation are illustrated by the flow chart 500 of FIG. 5. For each function 520 found in the function triple list, a node in the functional visualization template is created at block 530. Additionally, the pair <component, variable> is attached to each function at block 540. Similarly, for each connector 550 found in the connection triple list, a connector is created in the template at block 560 including its type at block 570. Finally, the functional visualization template is written to file at block 580 for further processing by the simulation tool before the sub-operation ends at block 590.

The operation of writing functional visualization template to file (block 580) performs the following activities:
  Configure each function node with its layout;
  Configure each connection node with its layout;
  Set up attributes such as color, font and model information to each function in the function node;
  Set up attributes such as color, style and font, etc. to each connector in the connections;
  Attach each functional node to the functional visualization file;
  Attach each connection node to the functional visualization file; and
  Create and attach subscriptions to the specified variables.

Figure 6:
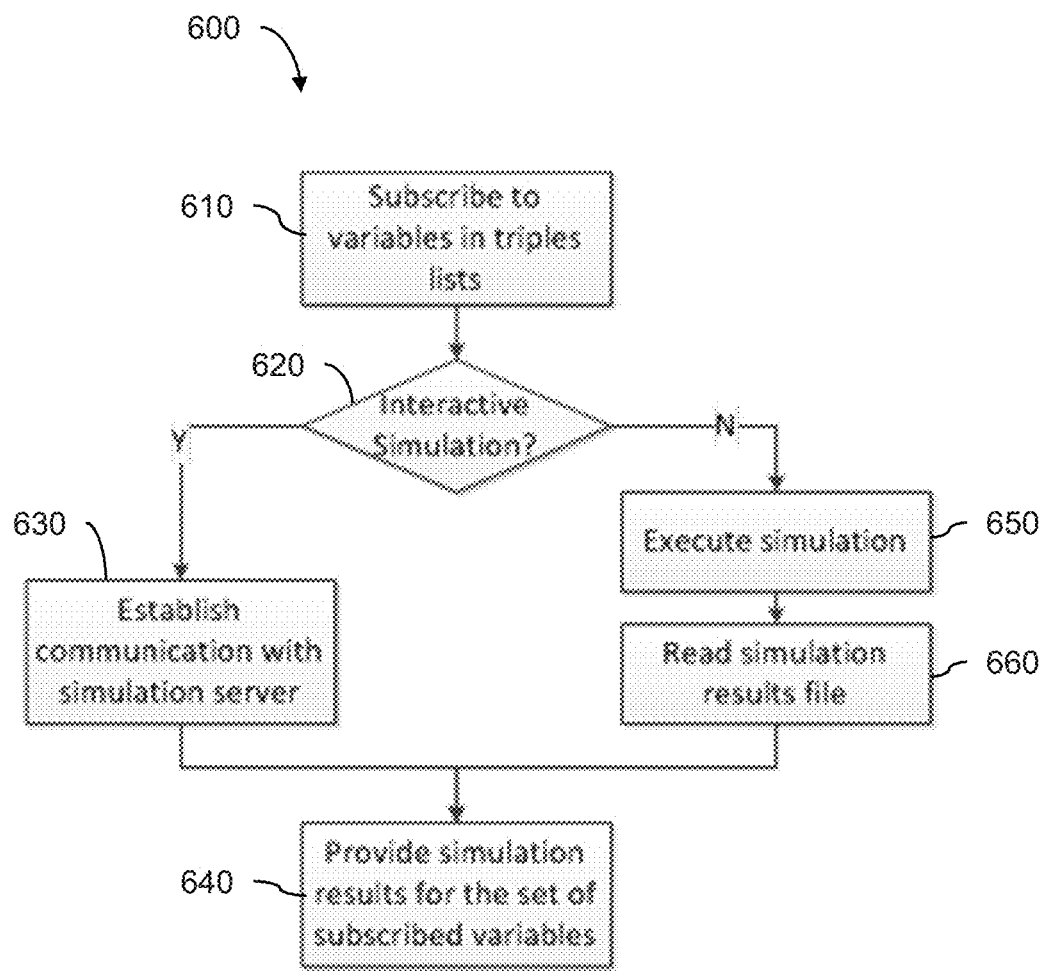
FIG. 6 is a block diagram showing details of the connect to simulation operation according to embodiments of the disclosure.

The connect to simulation engine operation, shown as block 150 of FIG. 1, is responsible for utilizing the functional visualization model to visualize simulation results in a functional manner. The flow chart 600 of FIG. 6 shows the sub-operations necessary to accomplish this. It is necessary to subscribe (block 610) to all the variables found in the triples lists generated previously in order to see the simulation results associated with the functional model. Depending on the target simulator's capabilities on interactive simulation (decision 620), there are two possibilities to pass simulation data to the functions. If interactive simulation is supported by the simulator, then communication is established with the simulation server at block 630. That communication may be TCP/IP, shared memory, etc. If interactive simulation is not possible, then it is necessary to first execute the simulation at block 650, and then read the simulation results file at block 660. The last step is to provide the simulation results for the set of subscribed variables.

Figure 7:
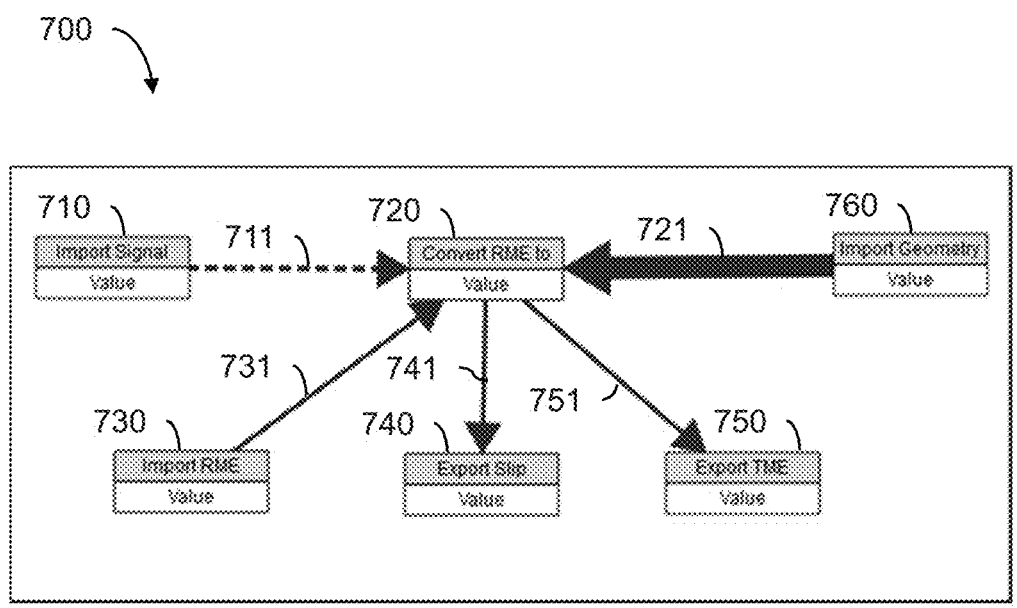
FIG. 7 is a representation of a functional visualization of the simulation results according to embodiments of the disclosure.

The display simulation results in functional visualization operation, shown as block 160 of FIG. 1, propagates the data from the subscribed variables to the graphical user interface used to produce the presently described functional visualization. The example functional visualization 700 of FIG. 7 is generated in the Amesim simulation environment and shows the functional model associated with the vehicle simulation component 300 described with reference to FIG. 3. Note that the "Value" fields in the functions 710, 720, 730, 740, 750, 760 are substituted by the numerical values of the physical variables to which the function is subscribed when visualizing the simulation. The connections are displayed according to the state of the associated system variables. For example, the color, arrow direction, arrow type, animations, labels, captions, icons, etc. may be defined according to the state of the associated system variables. In the example visualization 700, based on associated system variable states, arrow 711 is dashed, arrow 721 is bold, and the direction of arrow 731 is different from the directions of arrows 741, 751.

Figure 8:
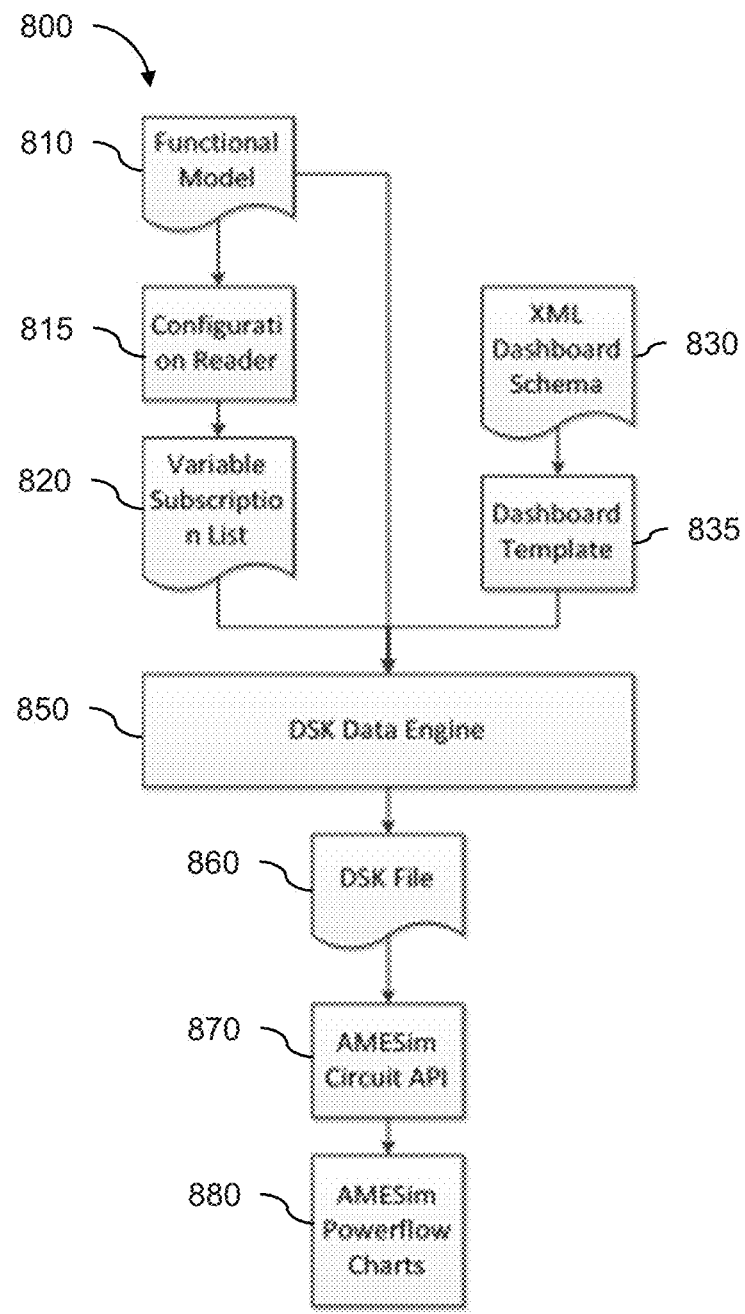
FIG. 8 is a block diagram representing an architecture of a functional visualization prototype implementation according to embodiments of the disclosure.

An architecture of a functional visualization prototype implementation 800 for proof of concept is shown in FIG. 8. The implementation uses the Amesim simulation tool. The C# .NET and LINQ library have been adapted to implement the prototype functional visualization 700. The functional model 810 is input to a configuration reader 815, which outputs a variable subscription list 820. An XML dashboard schema 830 is input to a dashboard template 835. The XML Schema is given by Amesim and has been used as one of the guidelines to implement the above-mentioned method. A DSK data engine 850 produces the DSK file 860.

The Amesim Circuit API 870 is the mechanism that is used by the presently described implementation to register the DSK file 860 in the simulation model. Finally, the Amesim Powerflow Charts application 880 in the simulation tool is used to visualize the DSK file during or after a simulation run.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, a virtual instantiation, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. A computer readable medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable medium may be any tangible, non-transitory medium that can contain or store a program for use by or in connection with an instruction execution system, apparatus, or device.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article or manufacture including instructions which implement the function/act specified in the flowchart and/or block diagram block or blocks.

The computer program instructions may also be loaded onto a computer, other programmable data processing apparatus, or other devices to cause a series of operations to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 9:
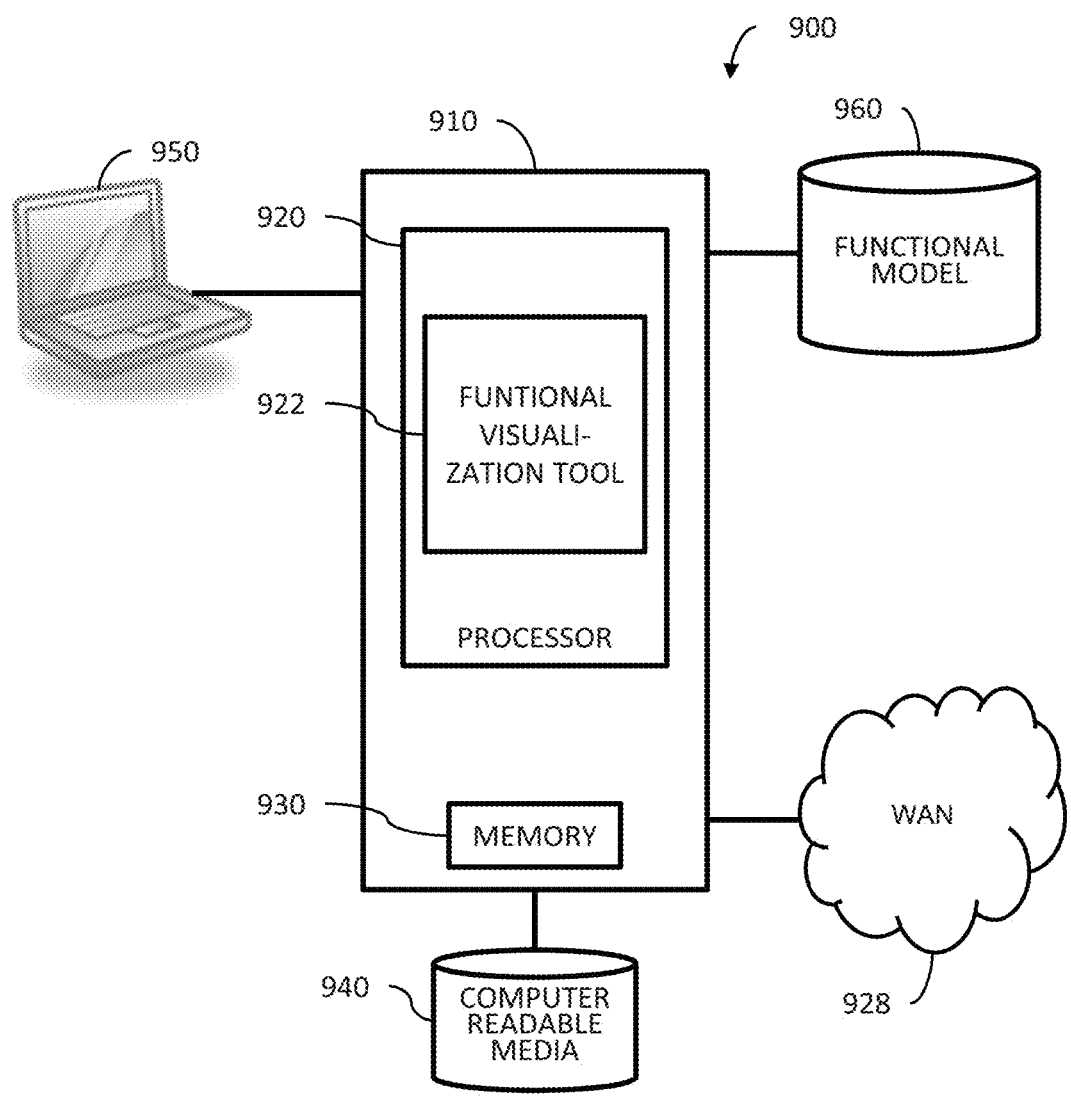
FIG. 9 is a block diagram representing an exemplary computer system according to embodiments of the disclosure.

Referring now to FIG. 9, according to an exemplary embodiment of the present invention, a computer system 910 within a simulation environment 900 can comprise, inter alia, one or more central processing units or processors (CPUs) 920 and a memory 930. The CPU 920 executes one or more program modules that perform specific tasks and interact with the environment of the computer system 910. One such module is a functional visualization tool 922 as described in this disclosure.

The computer system 910 also interacts with a human-machine-interaction (HMI) station 950 that facilitates interactions between the human users and the automation environment. The HMI station 950 is generally coupled to a display and various input devices such as a mouse and keyboard (not shown). The HMI station 950 provides the visualization display discussed above. The computer system 910 may additionally communicate with other systems and devices via a wide area network (WAN) 928 such as the Internet.

The memory 930 can include RAM, ROM, disk drive, tape drive, etc., or a combination thereof. Exemplary embodiments of present invention may be implemented as a routine stored in memory 930 or other non-transitory computer-readable storage media 940 and executed by the CPU 920. As such, the computer system 910 is a general-purpose computer system that becomes a specific purpose computer system when performing methods of the present disclosure.

The computer system 910 also includes an operating system and micro-instruction code. The various processes and functions described herein may either be part of the micro-instruction code or part of the application program (or a combination thereof) which is executed via the operating system. In addition, various other peripheral devices may be connected to the computer system 910 such as a data storage device 960 containing the functional model.

The flowcharts and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although various embodiments that incorporate the teachings of the present invention have been shown and described in detail herein, those skilled in the art can readily devise many other varied embodiments that still incorporate these teachings. The invention is not limited in its application to the exemplary embodiment details of construction and the arrangement of components set forth in the description or illustrated in the drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass direct and indirect mountings, connections, supports, and couplings. Further, "connected" and "coupled" are not restricted to physical or mechanical connections or couplings.

What is claimed is:

1. A method for visualizing functions of a system based on data from a simulation environment, comprising:
    importing a functional model of the system from the simulation environment, including a plurality of function nodes and a plurality of connections, each connection linking two of the function nodes;
    for each of the function nodes, creating a function configuration triple including a function description, a system component with which the function is associated, and at least one system variable with which the function is associated;
    for each of the connections, creating a connection configuration triple including a source function and a destination function selected from the function nodes, and a type of flow associated with the connection;
    generating a functional visualization file from the function configuration triples and the connection configuration triples;
    including in the functional visualization file, a subscription list of variables associated with each of the functions of the function configuration triples;
    subscribing to retrieve values for each of the system variables in the subscription list based on the function configuration triples from the simulation environment; and
    displaying a functional visualization based on the functional visualization file and the system variables.

2. The method of claim 1, wherein generating a functional visualization file further comprises generating a functional visualization file according to an XML schema file describing a specific file format understood by the simulation environment.

3. The method of claim 1, wherein generating a functional visualization file further comprises setting visualization attributes for each of the function nodes and connections.

4. The method of claim 3, wherein the visualization attributes are selected from a set of attributes consisting of coordinates, color, size, font type, and appearance of function nodes and connections.

5. The method of claim 3, wherein the visualization attributes cause transitions of appearance of the function nodes and the connections depending on conditions met by the system variables.

6. The method of claim 1, wherein the simulation environment is capable of interactive simulation, and subscribing to retrieve values for each of the system variables from the simulation environment further comprises:
    establishing a connection with a simulation server of the simulation environment; and
    subscribing to receive values of the system variables as they are available.

7. The method of claim 1, wherein the simulation environment is not capable of interactive simulation, and subscribing to retrieve values for each of the system variables from the simulation environment further comprises:
    subscribing to receive a simulation results file from the simulation environment.

8. The method of claim 1, wherein displaying a functional visualization based on the functional visualization file and the system variables further comprises displaying function descriptions together with values for associated system variables, and connections connecting the source functions and the destination functions.

9. The method of claim 8, wherein the connections are displayed according to the type of flow associated with the connection.

10. The method of claim 8, wherein an attribute of a connection is displayed according to the values of the system variables, the attribute being selected from a set of attributes consisting of a color, a direction, an arrow type, an animation, a label, a caption and an icon.

11. A system for visualizing functions of a system based on data from a simulation environment, comprising:
    a processor;
    an interface between the processor and the simulation environment;
    a graphical display connected to the processor;
    computer readable media containing computer readable instructions that, when executed by the processor, cause the processor to perform the following operations:
        importing a functional model of the system via the interface between the processor and the simulation environment, including a plurality of function nodes and a plurality of connections, each connection linking two of the function nodes;
        for each of the function nodes, creating a function configuration triple including a function description, a system component with which the function is associated, and at least one system variable with which the function is associated;

for each of the connections, creating a connection configuration triple including a source function and a destination function selected from the function nodes, and a type of flow associated with the connection;

generating a functional visualization file from the function configuration triples and the connection configuration triples;

including in the functional visualization file, a subscription list of variables associated with each of the functions of the function triples;

subscribing to receive values for each of the system variables in the subscription list based on the function configuration triples through the interface between the processor and the simulation environment; and displaying, using the graphical display, a functional visualization based on the functional visualization file and the system variables.

12. The system of claim 11, wherein generating a functional visualization file further comprises generating a functional visualization file according to an XML schema file describing a specific file format understood by the simulation environment.

13. The system of claim 11, wherein generating a functional visualization file further comprises setting visualization attributes for each of the function nodes and connections.

14. The system of claim 13, wherein the visualization attributes are selected from a set of attributes consisting of coordinates, color, size, font type, and appearance of function nodes and connections.

15. The system of claim 13, wherein the visualization attributes cause transitions of appearance of the function nodes and the connections depending on conditions met by the system variables.

16. The system of claim 11, wherein the simulation environment is capable of interactive simulation, and subscribing to receive values for each of the system variables through the interface with the simulation environment further comprises:

establishing communication with a simulation server of the simulation environment; and subscribing to receive values of the system variables as they are available.

17. The system of claim 11, wherein the simulation environment is not capable of interactive simulation, and subscribing to receive values for each of the system variables through the interface with the simulation environment further comprises:

subscribing to receive a simulation results file from the simulation environment.

18. The system of claim 11, wherein displaying a functional visualization based on the functional visualization file and the system variables further comprises displaying function descriptions together with values for associated system variables, and connections connecting the source functions and the destination functions.

19. The system of claim 18, wherein the connections are displayed according to the type of flow associated with the connection.

20. The system of claim 18, wherein an attribute of a connection is displayed according to the values of the system variables, the attribute being selected from a set of attributes consisting of a color, a direction, an arrow type, an animation, a label, a caption and an icon.

* * * * *